(12) United States Patent
Rehm

(10) Patent No.: US 6,619,472 B2
(45) Date of Patent: Sep. 16, 2003

(54) ADJUSTING UNIT

(75) Inventor: Johannes Rehm, Schelklingen (DE)

(73) Assignee: Rehm Anlagenbau GmbH (DE)

(*) Notice: Subject to any disclaimer, the term of this patent is extended or adjusted under 35 U.S.C. 154(b) by 103 days.

(21) Appl. No.: 09/777,714

(22) Filed: Feb. 6, 2001

(65) Prior Publication Data

US 2002/0005336 A1 Jan. 17, 2002

Related U.S. Application Data

(63) Continuation-in-part of application No. 09/259,577, filed on Mar. 1, 1999, now Pat. No. 6,182,819.

(30) Foreign Application Priority Data

Jun. 15, 1998 (DE) ......................................... 298 10 695

(51) Int. Cl.[7] .............................................. H05K 3/34
(52) U.S. Cl. ............................. 198/803.11; 198/345.1
(58) Field of Search ...................... 198/803.11, 345.1; 29/760; 269/71

(56) References Cited

U.S. PATENT DOCUMENTS

| | | | |
|---|---|---|---|
| 2,362,067 A | | 11/1944 | Heinrich ........................ 81/26 |
| 3,880,074 A | * | 4/1975 | Seifert ................... 198/803.11 |
| 4,787,505 A | | 11/1988 | Tweedy ................. 198/803.01 |
| 5,094,131 A | | 3/1992 | Sorensen et al. ............. 81/152 |
| 5,346,058 A | | 9/1994 | Santandrea et al. .... 198/803.01 |
| 5,348,142 A | * | 9/1994 | Nishimura et al. ..... 198/803.01 |
| 5,511,651 A | | 4/1996 | Barth ......................... 198/817 |
| 5,540,376 A | | 7/1996 | Asla et al. ..................... 228/37 |
| 5,685,413 A | * | 11/1997 | McGough .............. 198/803.01 |
| 6,089,365 A | * | 7/2000 | Galassi et al. ......... 198/867.08 |
| 6,182,819 B1 | * | 2/2001 | Rehm .................... 198/803.11 |

FOREIGN PATENT DOCUMENTS

| | | |
|---|---|---|
| DE | 88 11 968 U | 11/1989 |
| DE | 4010359 | 10/1991 |
| DE | 92 02 368 U | 9/1992 |

* cited by examiner

Primary Examiner—Douglas Hess
(74) Attorney, Agent, or Firm—Sheridan Ross P.C.

(57) ABSTRACT

An adjusting unit for an article carrier is disclosed. The adjusting unit includes adjustable support elements for receiving articles of different sizes, in particular for supporting printed circuit boards of different sizes with a frame. One frame member of the frame may be used as a support for an article to be carried. At least one additional supporting element is provided which is adapted to be adjusted relative to a frame member. In addition, arresting structures are provided with the aid of which the supporting element can be arrested relative to the frame member. The arresting structures are adaptable to be releasably arrested on a guide, along which the supporting element is displaceable. Accordingly, the adjusting unit comprises adjustment structure for adapting the adjustable supporting element of the article carrier to the size of the printed circuit boards to be accommodated.

21 Claims, 7 Drawing Sheets

ADJUSTING UNIT

CROSS-REFERENCE TO RELATED APPLICATIONS

The present application is a continuation-in-part application of U.S. patent application Ser. No. 09/259,577, filed Mar. 1, 1999 now U.S. Pat. No. 6,182,819. Foreign priority benefits are claimed under 35 U.S.C. §119 to German Patent Application Serial No. 298 10 695.7 (U.M.), filed Jun. 15, 1998. The entire disclosure of U.S. patent application Ser. No. 09/259,577 is incorporated herein by reference.

The present invention refers to an adjusting unit for an article carrier with adjustable support elements for receiving thereon articles of different sizes, in particular printed circuit boards of different sizes, with a frame means, especially one frame member of said frame means being used as a support for an article to be carried, and at least one additional supporting element which is adapted to be adjusted relative to the frame member, wherein arresting means are provided with the aid of which the supporting element can be arrested relative to the frame member, said arresting means being adapted to be releasably arrested on a guide means along which the supporting element is displaceable.

Such an adjusting unit for article carriers may be used as a separate unit within a process line for processing e.g. printed circuit boards that are carried by the article carrier. In this process line a number of further systems may be used, such as e.g. a reflow soldering systems, a curing system, a drying system, etc.

It is also possible that the adjusting unit according to the invention is integrated in one of the above-mentioned systems, such as e.g. in a reflow soldering system.

Reflow soldering systems by means of which electronic components premounted on printed circuit boards are soldered and thus electrically connected to a wiring scheme on the printed circuit board under the influence of heat are generally known in the prior art. In such reflow soldering systems, it is necessary to transport the articles, i.e. the printed circuit boards, through a comparatively long system with different zones, such as e.g. a preheating zone, a main heating zone, a cooling zone and a discharge area. The printed circuit boards are moved through these zones on an article carrier by means of a transport mechanism, e.g. a conveying chain or a link belt driven by the system.

Such a reflow soldering system is an acquisition necessitating a very high investment. Hence, it goes without saying that it is necessary that such a system is suitable for more than one specific size of printed circuit board. For treating printed circuit boards of various sizes in such a reflow soldering system, it has hitherto been common practice to replace the article carrier by an article carrier adapted to the size of the printed circuit board to be processed at the time in question. This required, on the one hand, the provision of a comparatively large supply of suitable article carriers for the respective sizes of the printed circuit boards to be processed; on the other hand, complicated and time-consuming manipulations by an operator were necessary for exchanging the article carriers upon changing from one size of printed circuit boards to a new one.

Even if stocks of many different article carriers were kept in supply, it was only possible to process standard sizes of printed circuit boards to which the article carriers were adapted. Specially manufactured printed circuit boards could not be transported through such a reflow soldering system. For solving this problem, the individual article carriers had to be modified or adapted by hand by an operator.

However, any intervention on the part of the operator in the operation of a reflow soldering system results in a drastic decrease of the efficiency of the throughput through the system, and, in connection with the high acquisition costs of a reflow soldering system, this results in a significant problem of costs.

The disadvantages outlined with respect to the reflow soldering system as set forth above are also valid for any other system for processing e.g. printed circuit boards, such as curing systems, drying systems, varnishing systems, etc.

It is, therefore, an object of the present invention to provide an adjusting unit of the type mentioned at the beginning, which makes use of an adjustable article carrier and by mean of which an adaptation of the article carrier to the size of a printed circuit board to be processed can be carried out automatically and mechanically, i.e. by machine.

To overcome the disadvantages outlined above and to solve the problem underlying the invention, the adjusting unit comprises adjustment means for adapting the adjustable supporting element of the article carrier to the size of an article to be accommodated.

The adjusting unit according to the present invention provides a mechanical, automatic adaptation of the article carriers to the article size to be processed at the time in question. Hence, the downtime of the system resulting from an intervention of an operator for adjusting the article carriers is minimised, and, simultaneously, the adaptation accuracy can be increased by means of an automatic and mechanical execution of the adjustment process.

As already mentioned the adjusting unit may be a stand-alone unit but may also be an integrated part of another system, such as e.g. a reflow soldering system.

To release the supporting element relative to the frame member, the adjustment means may be provided with delocking means which are adapted to be displaced in a direction along with the position of the supporting element.

A simple embodiment of the delocking means can be characterised in that the delocking means comprise gripper elements with the aid of which clamping plates of the arresting means of the article carrier are movable in the direction opposite to a biasing force applied to the clamping plates so as to release the clamping contact of said clamping plates with the guide means. The guide means of the article carrier may be rod-like rails along which the clamping plates may be moved.

The adjusting unit may also be provided with a vertical adjustment means for adjusting a level of a centre support of the article carrier. In such a way a complete mechanical adaptability of the article carrier with regard to the dimension of the printed circuit boards to be processed as well as with regard to the level of the centre support is automatically possible.

An example for such a vertical adjustment means are wedge-like elements by means of which a displaceable plate as part of one of the support elements may be raised or lowered.

To provide at least a support for the article carrier during its adjustment, the adjusting unit comprises supporting means for supporting frame members of the article carrier at least in adjustment position of the support elements. The supporting means may also be used for moving the article carrier to and from the adjustment position and also to move the article carrier through the adjusting unit or any system in which the adjusting unit is incorporated.

According to a simple embodiment of the supporting means, they may be formed by two parallelly spaced support rails on which outwardly extending flanges of the frame members of the article carrier are placed.

To avoid any displacement of the article carrier as long as it is adjusted to the size of the printed circuit board as an article, the adjusting unit may comprise at least one clamping means vertically movable for clamping rail and flange to affix the article carrier in its adjustment position.

It may be advantageous if the clamping means are movable along the rails such that different article carriers may be fixed by the same clamping means or such that one article carrier may be clamped at different positions.

To avoid any interference of the clamping means with e.g. the supporting elements of the article carrier, clamping means may be arranged outwardly of the support rails.

To securely clamp the article carrier in its adjustment position it may be advantageous if the clamping means comprises two spaced clamping elements which are releasably fixed to a yoke member extending essentially parallel to the support rails, which yoke member is connected to a piston of a lifting cylinder. Consequently, the vertical movement of the clamping means is realised by a vertical movement of the yoke member by actuating the lift cylinder.

To support the gripper elements in an easy way and also to move them without difficulty, the gripper elements may be pivotally or slidably supported by a vertically movable gripper body.

The gripper body may be raised and lowered in the vertical direction by a spindle or the like. Another advantageous embodiment of the invention uses a rack-and-pinion drive for movably supporting a gripper body.

As an example the gripper body may be connected to a toothed rack of the drive and the drive's pinion may be arranged on a drive shaft of an electric motor. By actuating the electric motor, the pinion is rotated and the toothed rack is raised or lowered correspondingly together with the gripper body connected thereto.

To avoid any misalignment of the gripper element and the arresting means of the article carrier, the adjusting unit may comprise a centring means that is assigned to the delocking means for centring the supporting element of the article carrier with respect to the delocking means.

As the supporting element is bar- or plate-like, the centring means may comprise a lifting cylinder and a fork-like centring element at the top of the lifting cylinder. By the lifting cylinder the centring element may be raised and lowered, wherein the centring element seizes the supporting element by its fork-like aperture.

To avoid any interference with the clamping means, the centring means and delocking means may be arranged between the supporting rails.

As the centring means and delocking means are operated together, they may be simultaneously displaceable in longitudinal direction of the support rails.

To delock the support element at both of its ends, a pair of plate-like gripper elements and one centring element may be assigned to each support rail, i.e. to each end of the support elements of the article carrier.

To simplify the movement of delocking means and centring means a carriage may be used that is arranged between the supporting rails and that is movable in longitudinal direction of the rails with at least said centring means and said delocking means arranged on the carriage.

There are different possibilities to move the carriage, such as e.g. a spindle or the like. Another example for moving the carriage is a carriage that is fixed to an endless belt which is movable in longitudinal direction of the support rails.

To energise the different element of the delocking means, centring means, etc., such as e.g. the lift cylinders, the carriage may be connected to a chain with a plurality of chain segments through which supply lines are guided. The chain connects the carriage to a frame or body of the adjusting unit and during movement of the carriage the chain will provide a deformable or adjustable connection along which the supply lines are securely guided.

In the following, the present invention will be explained and described in detail on the basis of an exemplary embodiment with reference to the drawings enclosed, in which.

Figure 1:
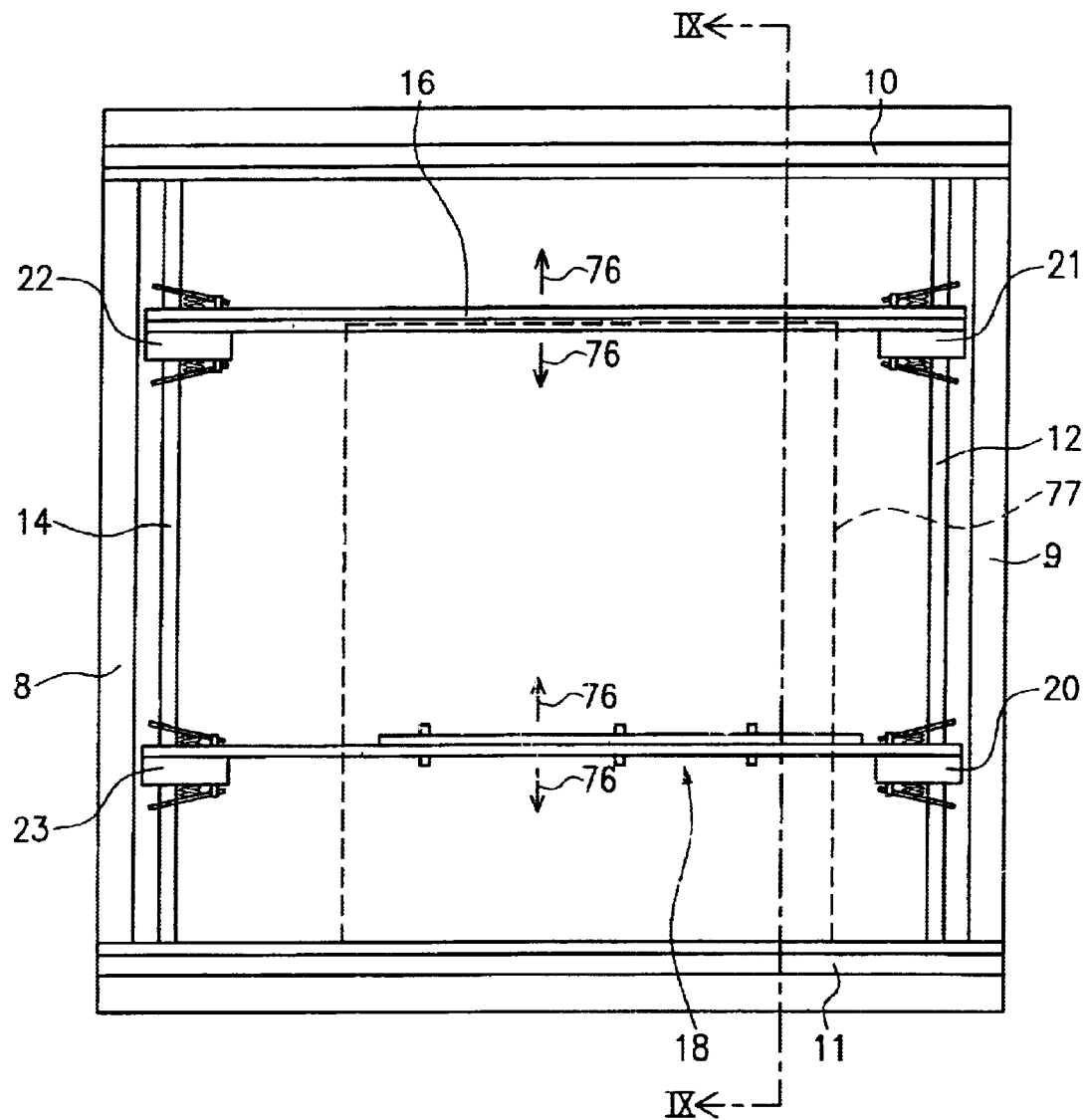
FIG. 1 shows a top view of an article carrier.

FIG. 1 shows a top view of an article carrier that may be used in an adjusting unit according to the present invention. The article carrier comprises an outer frame means consisting of four frame members 8, 9, 10 and 11 which are joined such that they essentially define a rectangle. Between the two parallel frame members 10 and 11, two rails 12 and 14 are attached in the vicinity of the lateral frame members 8 and 9, said rails 12, 14 extending substantially at right angles to said frame members 10 and 11. Said rails have attached thereto a supporting element 16 via respective arresting elements 21 and 22 and a vertically adjustable centre support 18 via respective arresting elements 20 and 23. By means of the arresting elements 20, 21 22 and 23 provided on the rails 12 and 14, the centre support 18 and the support element 16 are attached such that they can releasably be locked in position; hence, they can be displaced in direction 76 along the rail when the locking engagement has been released.

Figure 2:
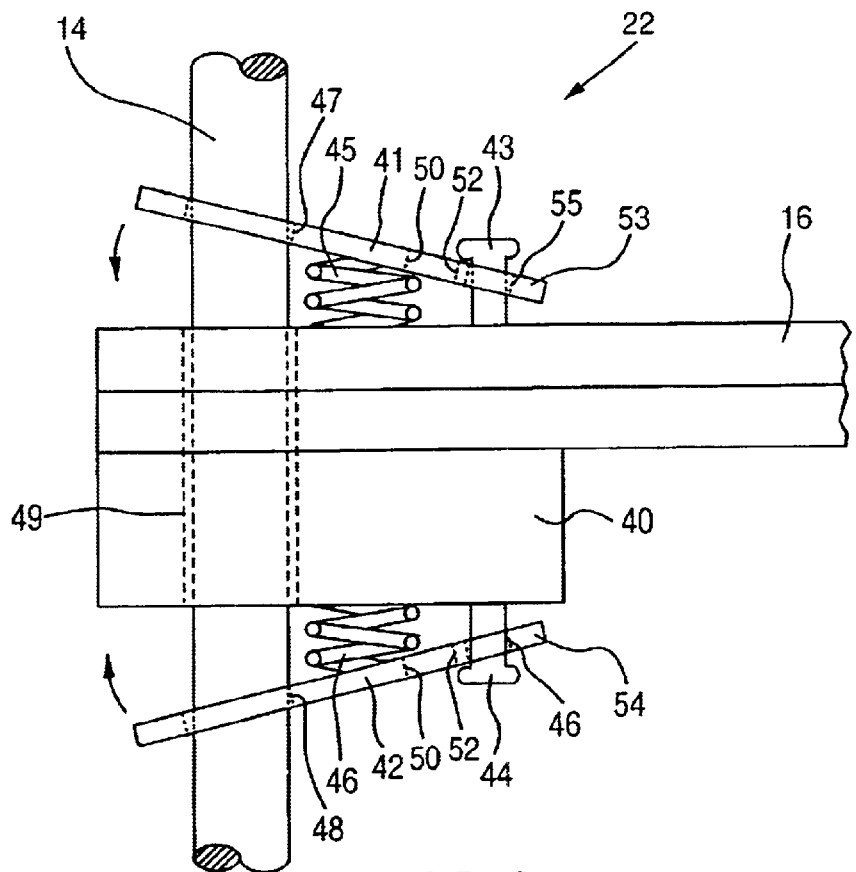
FIG. 2 shows a top view of an arresting means in detail.

FIG. 2 shows a top view of the arresting element 22 in an enlarged representation,. The supporting element 16 has a body 40 secured thereto, said body 40 being provided with an opening 49 through which the substantially rod-shaped rail 14 extends. The body 40 has attached thereto clamping plates 41 and 42 at both sides thereof, each of said clamping plates 41, 42 being articulated on the body 40 at its end facing away from the rail 14. The articulated connection with the body 40 comprises bollards 43 and 44 projecting on either side of the body 40. The clamping plates 41 and 42 have openings 55 and 56 in the area of the articulated connection, said openings encompassing the bollards 43 and 44 between the expanded ends and the body. Said openings 55 and 56 are dimensioned such that an amount of play is provided, which suffices to move the clamping plates 41 and 42 through a large angular area without breaking the articulated connection. In addition, respective springs 45 and 46 are provided between the body 40 and the clamping plates 41 and 42, said springs 45, 46 resting on the body 40 on the one hand and on a central area of the respective clamping plate on the other. By means of the springs 45 and 46, the clamping plates 41 and 42 are spring-loaded towards a position which is deflected relative to the parallel abutting position on the body 40. In addition, the clamping plates 41 and 42 have a respective opening 47, 48 in the area of the rail 14, said opening 47, 48 being implemented such that it is essentially complementary to the cross-sectional shape of rail 14 and slightly larger than said rail 14. The sizes if said openings 47 and 48 in connection with the opening 49 and the cross-sectional shape and the size of rail 14 are adapted to one another in such a way that, due to the fact that the clamping plates 41 and 42 are spring-loaded relative to the body 40 by means of the springs 45 and 46, the respective clamping plates are brought into contact with the rail in the area of the openings, which has the effect that the rail is either clamped in position in the respective opening 47, 48 or that it is fixed by clamping contact with the inner wall if the opening 49.

For unlocking, the clamping plates 41 and 42 are moved, in a direction opposite to the spring-based direction, to a position where they extend essentially at right angles to the length of the rail 14, i.e. they are pressed onto the lateral surfaces of the body 40. Unlocking is effected mechanically, i.e. by the adjusting unit according to the invention. When the clamping plates 41 and 42 are pressed together, i.e. unlocked, the supporting element 16 can be displaced along the rail 14 by displacing delocking means of the adjusting unit with the arresting element 22.

Figure 3:
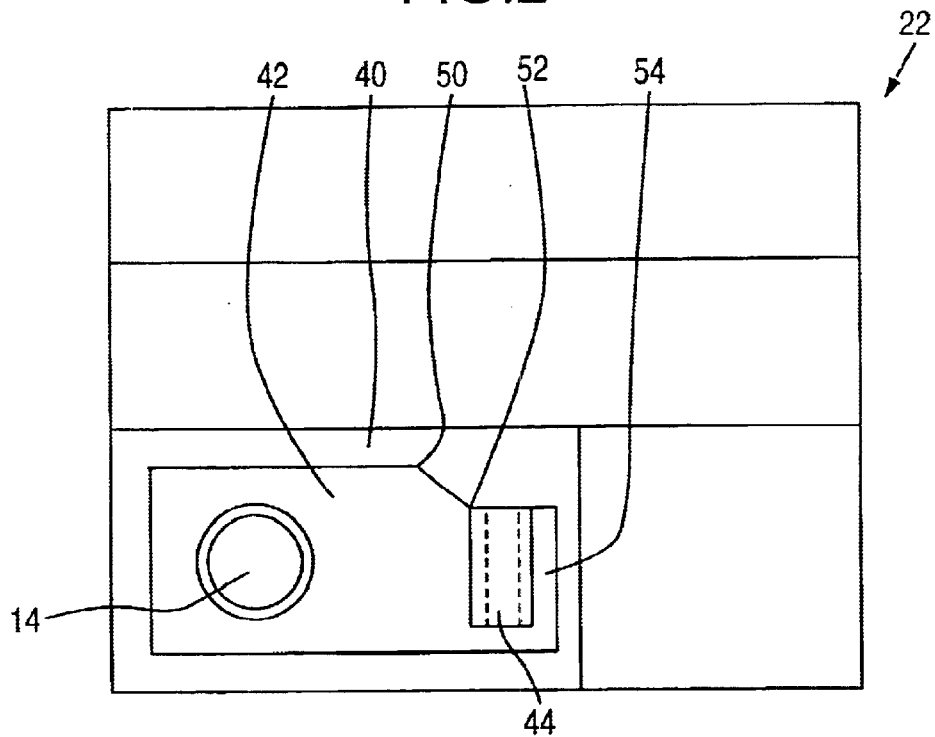
FIG. 3 shows a side view of the arresting means shown in FIG. 2.

FIG. 3 shows a side view of the arresting element 22 shown in FIG. 2. The side view of the arresting element 22 clearly shows the structural design of the clamping plate 42, especially the way in which the articulated connection with the body 40 is formed. The clamping plate 42 tapers in the direction of the articulated connection at the upper lateral edge thereof, with width of the clamping plate decreasing in the area between two break points 50 and 52 of the lateral line. In an end portion 54 of the clamping plate, a U-shaped opening is provided, which is engaged by a bollard 44 whose shape is complementary to that of the U-shaped opening, said bollard 44 having an elongate cross-section and being fixedly connected to the body 40.

Neither the shape of the clamping plate 42 nor the implementation of the articulated connection are limited to the embodiment described in the present connection The point of articulation can also be at the other end of the clamping plate and, if desired, the plate end projecting beyond the rail 14 can be extended. The plate can have any desired shape, said shape being not limited to the form which tapers towards the point of articulation and which is precisely shown in the present connection. Whereas the articulated connection shown in the present context is particularly simple and easy to manufacture, it would also be imaginable to use a hinged joint or other kinds of connections.

Quite generally, the clamping effect can be achieved not only by means of an arresting element of the kind shown in FIG. 2 and 3 but also with the aid of e.g. a rail with expansion means. The rail, in turn, is not limited to the rod shape shown in the present connection, but is may have any kind of profile, e.g. a T-section.

Figure 4:
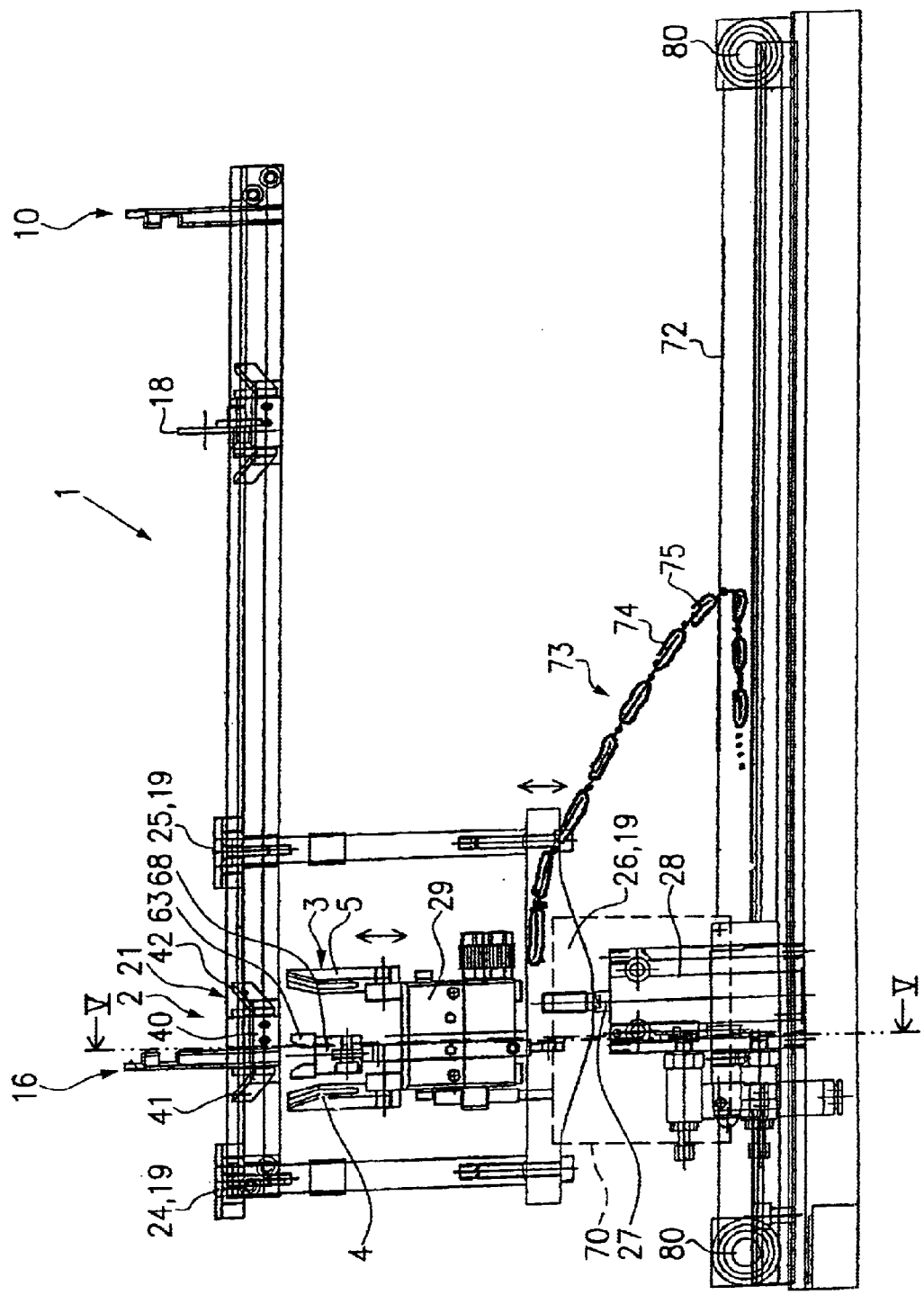
FIG. 4 shows a lateral view of adjusting unit according to the present invention.

FIG. 4 shows a side view of one embodiment of an adjusting unit 1 according to the invention.

Figure 5:
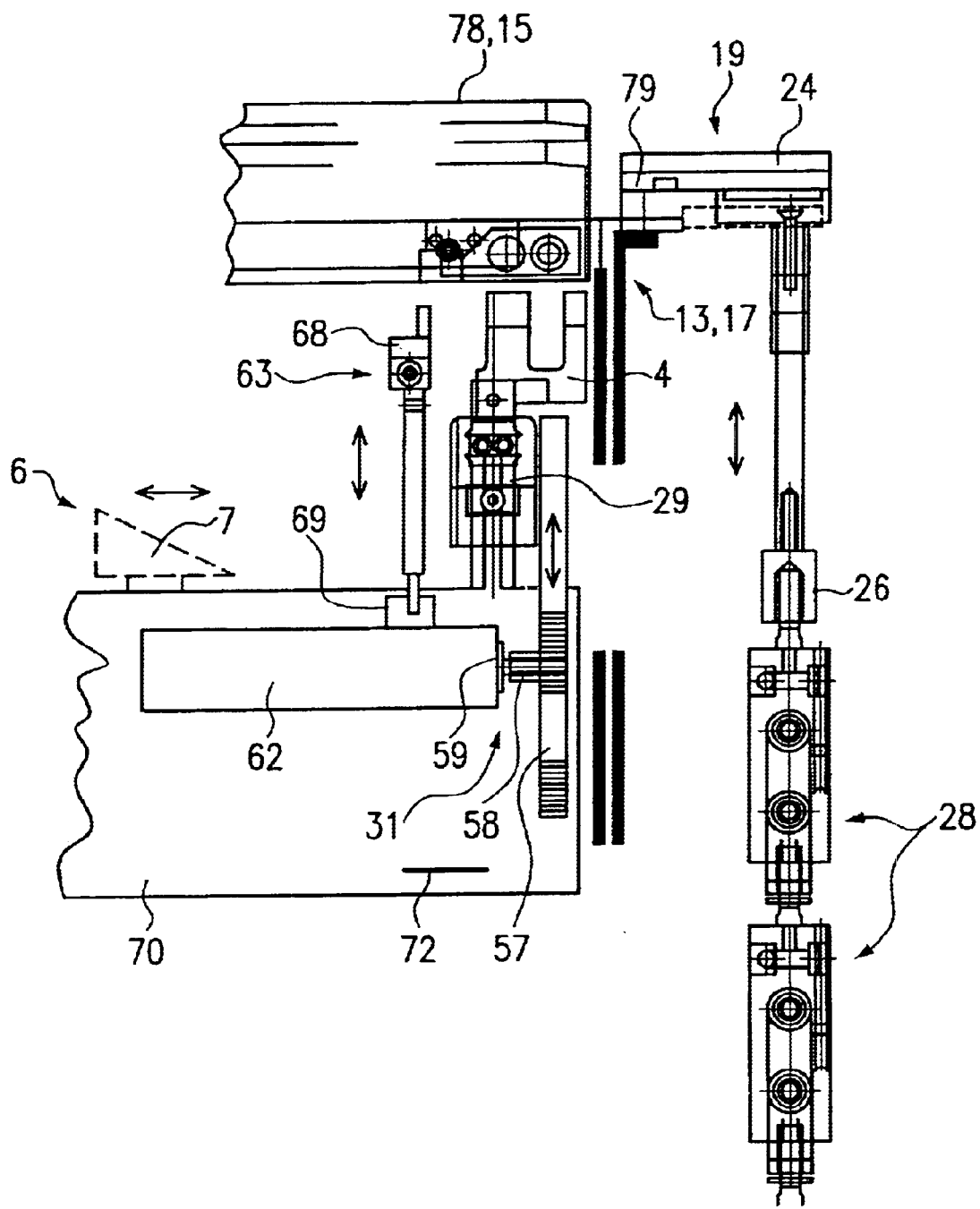
FIG. 5 shows a cross-sectional view of the adjustment unit along line V—V of FIG. 4.

The adjusting unit comprises supporting means 13 in the form of two parallelly spaced support rails 17 along which the product carriers 78, see FIG. 5, may be guided and with respect to which the article carrier 78 is fixed in an adjustment position 15. The adjusting unit 1 may be a stand-alone unit but may also be integrated in a system for processing printed circuit boards 77, see FIG. 1, that are placed on the article carrier. The adjusting unit 1 may be integrated in e.g. a reflow soldering system, a curing system, a drying system, a varnishing system, etc.

It should be noted that FIG. 4 shows a cross-sectional view along the transport direction for the printed circuit boards, wherein corresponding means, see the following discussion, are assigned to each support rail 17 of the supporting means 13.

The adjusting unit 1 comprises adjustment means 2 including delocking means 3 with gripper elements 4, 5, vertical adjustment means 6, see in particular FIG. 5, centring means 36, and clamping means 19.

The gripper elements 4, 5 of the delocking means 3 may be implemented as fixed U-shaped forks whose front distance width is dimensioned such that the arresting element 21 fits in precisely over the width of the body 40 including the height of the projecting bollards 43 and 44. When the U-shaped forks are pivoted or displaced along the clamping plates 41 and 42, the clamping plates are pressed onto the body 40 against the biasing force of the springs, see FIG. 2, whereby the clamping effect is eliminated and the locking engagement is released. When the gripper elements 4, 5 have been moved to the position at which the locking engagement is released, they can be displaced in a direction along supporting rail 17, whereby the position of the supporting elements will be displaced relative to frame member 11, see FIG. 1. By pivoting the gripper elements 4, 5 back or by drawing them back, the clamping effect is produced again and the arrestment is re-established.

For displacing or pivoting the two gripper elements 4, 5 are supported by a gripper body 29 arranged on an upper side of a carriage 70. For vertical displacement of the gripper elements 4, 5 the gripper body 29 is movable by a rack-end-pinion drive 31, see FIG. 5.

According to one embodiment of the invention a toothed rack 57 is fixed to a gripper body 29 and a pinion 58 of this rack-end-pinion drive 39 is arranged on a drive shaft 59 of an electric motor 62.

It is also possible that the gripper element 4, 5 are widened at their upper ends to simplify engagement with clamping plate 41, 42.

Adjacent to the delocking means 3 the centring means 36 are arranged. This means comprises a fork-like centring element 68 that is displaceable in vertical direction by a lift cylinder 69, see e.g. FIG. 5. The centring element 68 is used for centring the supporting element 16, see also FIG. 1, that is thereafter delocked and adjusted by the delocking means 3. The centring means 36 is also arranged on carriage 70 and is displaceable together with this carriage 70 in longitudinal direction of the support rails 17.

Delocking means 3 and centring means 36 are arranged between the two parallelly spaced support rails 17 of the supporting means 13 of the adjusting unit 1.

Outside of the two support rails 17 clamping means 19 are arranged. This clamping means comprises two clamping elements 24, 25, see also FIG. 5, that clamp with their free ends 79 flanges 60, 61, see FIG. 9, of frame members 8 and 9 on the supporting means 13 of the adjusting unit 1. The clamping elements 24, 25 are parallelly spaced to one another and fixed at their lower ends to a yoke member 26 extending perpendicular to the clamping elements 24, 25. The yoke member 26 is centrally supported by a piston 27 of a lift cylinder 28 for vertical displacement, see also FIG. 5.

It should again be noted that delocking means 3 with gripper elements 4, 5, clamping means 19 and centring means 36 are assigned to each of the support rails 17 on both ends of carriage 70. It should be further noted that the clamping means 19 are generally fixed with respect to the support rails 17 for defining the adjustment position 15 of the product carrier whereas carriage 70 with all the means attached thereto is movable along the longitudinal direction of the support rails 17. Moreover, as the clamping means 19 are arranged outside of the support rail 17 they do not interfere with the delocking means 3 or centring means 36 during their movement in longitudinal direction.

To supply the carriage and all the means arranged thereon and attached thereto with a respective energy source for operating these means the carriage is connected to a chain 73 with a plurality of chain segment 74, see FIG. 4. Through the chain segments 74 the corresponding supply lines 75 are guided. During movement of the carriage 70 chain 73 is more or less bent and partially drawn by the carriage 70.

To move the carriage in longitudinal direction it is fixed to an endless belt 72, see FIGS. 4 and 5, that is driven by respective sprockets 80 at the end of the displacement path of the carriage 70.

In FIG. 5 a cross-sectional view along V—V of FIG. 4 is shown. Additionally a wedge-like element 7 of a vertical adjustment means 6 is shown in FIG. 5 that is also attached to carriage 70 and that is displaceable along carriage 70, i.e. perpendicular to support rails 17. Instead of the wedge-like element 7 also a fork-shaped gripper may be used that can engage pin 32, see FIG. 7, of the vertically adjustable centre support 18 and displace the vertically adjustable plate 30 by a linear displacement along the direction of the support 39, whereby said displaceable plate 30 will move in the lateral as well as in the vertical direction in view of the inclined slot-shaped guide means 33, 34, see again FIG. 7.

Figure 6:
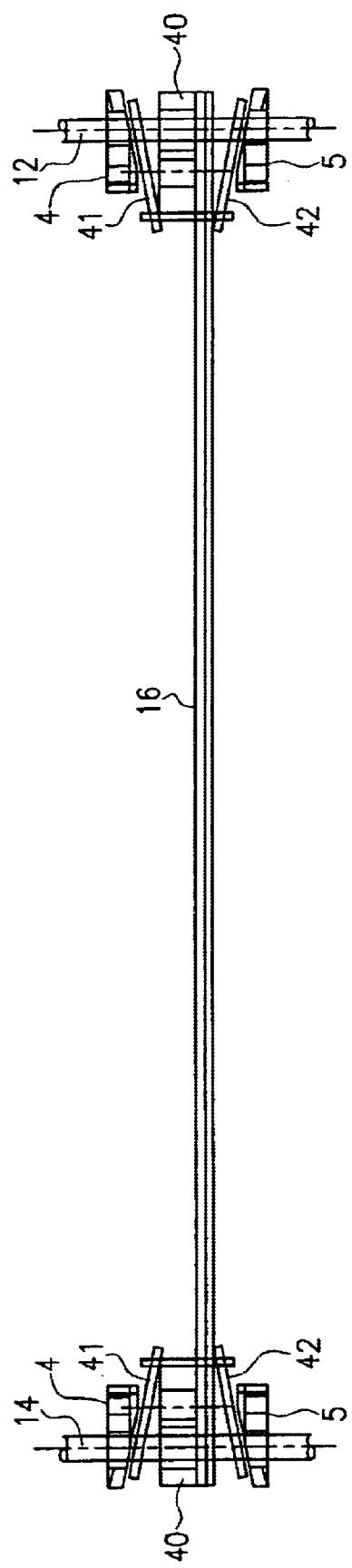
FIG. 6 shows a top view of the supporting element with clamping elements according to the invention.

FIG. 6 is a top view of supporting element 16 whereby most of the details, see FIGS. 4 and 5, are not illustrated. In FIG. 6 it is in particular illustrated that the clamping plate 41, 42 at both ends of supporting element 16 are pressed onto body 40 against the biasing force of springs 45, 46, see FIG. 2, by pressing the gripper elements 4, 5 thereon.

Figure 7:
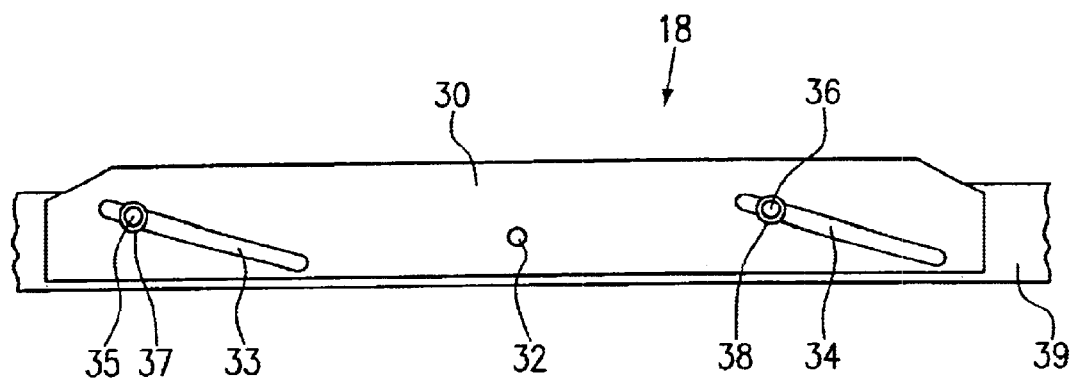
FIG. 7 shows a side view of a vertically adjustable centre support of an article carrier.

FIG. 7 shows a lateral view of a central area of the vertically adjustable centre support 18. A support 39, both ends of which are connected to a respective arresting element shown in FIG. 2 and 3, has attached thereto a displaceable plate 30 for vertical adjustment. The displaceable plate 30 is provided with two slot-shaped elongate guide means 33 and 34, which are parallel to one another and which are arranged on the same level in laterally displaced relationship with one another, said slot-shaped guide means 33, 34 forming an angel of more than 0° and less than 180° relative to the direction of the support 39. Two studs 35 and 36, which are fastened to the support 39 on the same level, project through these slot-shaped guide means. The ends of the studs, which either have screws fastened thereto or are expanded in some other way, support respective cup springs 37 and 38 by means of which the displaceable plate 30 is spring-loaded and pressed against the support 39. The displaceable plate 30 has attached thereto a laterally projecting pin 32, which serves as an actuating element or handle.

Due to the fact that the displaceable plate 30 is spring-loaded by the cup springs 37 and 38, the position of said displaceable plate 30 is stable due to the friction which is active between the two elements. The displaceable plate 30 can only be displaced relative to the support 39 if a force exceeding a certain threshold is applied, precise guidance being provided by the slot-shaped guide mean 33 and 34. When a force directed parallel to the support 39 is applied, the displaceable plate 30 is displaced relative to the support 39 not only with regard to its lateral but also with regard to its vertical position due to the inclination of the slot-shaped guide means 34 and 35 relative to the longitudinal direction of the support 39.

The configuration for the vertical adjustment shown here only represents an embodiment which is preferred on the basis of its mechanically simple structural design. In particular, this kind of vertical adjustment is preferably suitable for an automatic mechanical adjustment, since said vertical adjustment means 6 provided on the adjustment unit has to be brought into engagement with the pin 32 on the displaceable plate 30, whereupon it will suffice to displace said pin 32 in only one direction for causing also a vertical adjustment of the centre support. Since the inclination of the slot-shaped guide means 33 and 34 relative to the direction of the support 39 is known, also a quantitatively precise determination of the vertical adjustment is possible by adjusting the distance of displacement of the gripper along the direction of the support 39.

Figure 8:
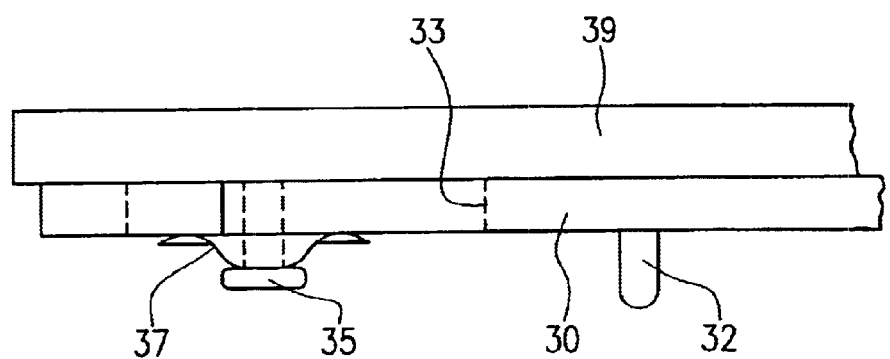
FIG. 8 shows a top view of the vertically adjustable centre support shown in FIG. 4.

In FIG. 8, the vertically adjustable centre support shown in a side view of FIG. 7 is shown in a top view. Said FIG. 8 shows in a particularly clear manner how the cup spring rests, on the one hand, on the bollard-like expanded end of the stud 35 projecting through the slot-shaped guide means 33 and, on the other hand, on the displaceable plate.

Figure 9:
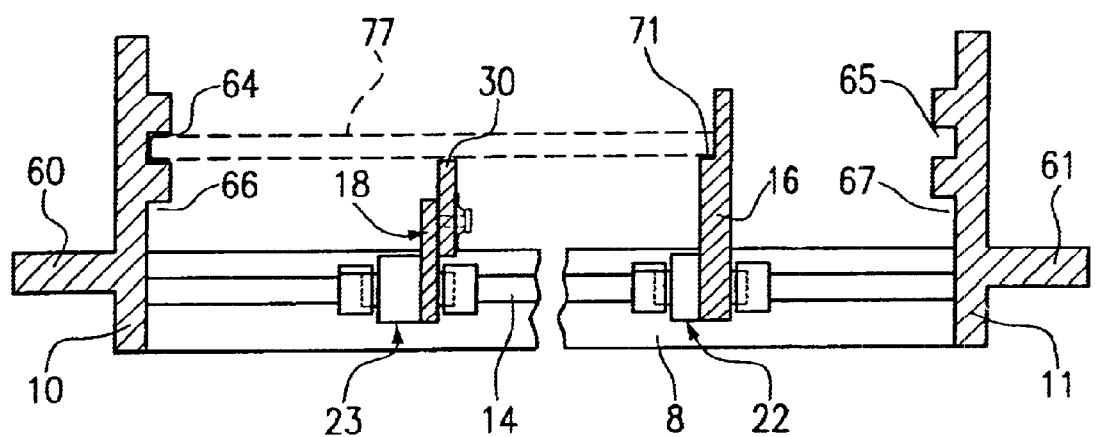
FIG. 9 shows a cross-sectional view of the article carrier along line IX—IX of FIG. 1.

FIG. 9 shows a cross-sectional view along line IX—IX in FIG. 1. According to the embodiment shown here, the frame members 10 and 11 have a profile with inwardly projecting strips 64, 66, and 65, 67, respectively, on which the printed circuit boards can rest. The supporting element 16 is provided with ledge 71 which extends on a level corresponding to that of the strip 64 and which can also serve as a support for a printed circuit board 77 to be carried. Between the left frame member 10 and the supporting element 16, the vertically adjustable centre support 18 is shown. The frame members are additionally provided with externally projecting flanges 60 and 61 on which the article carrier rest on said support rail 17 of the adjusting unit 1.

What is claimed is:

1. An adjusting unit for an article carrier for receiving thereon printed circuit boards of different sizes comprising:

a frame means including one frame member in direct contact with the printed circuit boards to be carried;

at least one supporting element which is adapted to be adjusted relative to the one frame member;

arresting means for arresting the supporting element relative to the one frame member;

a guide means along which the supporting element is displaceable; and an adjusting means for adapting the arresting means to the size of the printed circuit boards to be accommodated and which are provided with delocking means which are adapted to be displaced in a direction along which the position of the supporting element can be changed, wherein the delocking means comprise gripper elements with the aid of which clamping plates of the arresting means of the article carrier are movable in a direction opposite to a biasing force applied to the clamping plates so as to release a clamping contact of said clamping plates with the guide means.

2. The adjusting unit according to claim 1, wherein the adjustment means are provided with delocking means which are adapted to be displaced in a direction along which the position of the supporting element can be changed.

3. The adjusting unit according to claim 1, wherein vertical adjustment means are provided for adjusting a level of a centre support of the article carrier.

4. The adjusting unit according to claim 3, wherein the vertical adjustment means comprises a wedge-like element by means of which a displaceable plate as part of the support element of the article carrier is raised or lowered.

5. The adjusting unit according to claim 1, wherein supporting means are provided for supporting frame members of the article carrier at least in adjustment position of the support elements.

6. The adjusting unit according to claim 5, wherein the supporting means are two parallelly spaced support rails on which outwardly extending flanges of the frame members can be placed.

7. The adjusting unit according to claim 1, wherein the unit comprises at least one clamping means vertically movable for clamping rail and flange of the frame members to fix the article carrier in adjustment position.

8. The adjusting unit according to claim 7, wherein the clamping means are movable along the rail.

9. The adjusting unit according to claim 7, wherein the clamping means are arranged outwardly of the support rails.

10. The adjusting unit according to claim 9, wherein the clamping means comprise two clamping elements spaced from one another which are releasably fixed to a yoke member extending essentially parallel to the support rail which yoke member is connected to a piston of a lifting cylinder.

11. The adjusting unit according to claim 10, wherein the gripper elements are pivotally or slidably supported by a vertically movable gripper body.

12. The adjusting unit according to claim 11, wherein the gripper body is movably supported by a rack-end-pinion drive.

13. The adjusting unit according to claim 12, wherein the gripper body is connected to a toothed rack of said drive and its pinion is movably connected to a drive shaft of an electric motor.

14. The adjusting unit according to claim 1, wherein a centring mean is allocated to the delocking means for centring the supporting element of the article carrier.

15. The adjusting unit according to claim 14, wherein the centring means comprises a lifting cylinder and a fork-like centring element at its top.

16. The adjusting unit according to claim 14, wherein said centring means and delocking means are arranged between the support rails.

17. The adjusting unit according to claim 16, wherein said centring means and delocking means are simultaneously displaceable in longitudinal direction of the support rails.

18. The adjusting unit according to claim 17, wherein a carriage is arranged between the support rails and is movable in longitudinal direction of these rails with at least said centering means and said delocking means arranged on the carriage.

19. The adjusting unit according to claim 18, wherein said carriage is fixed to an endless belt movable in longitudinal direction of the support rails.

20. The adjusting unit according to claim 18, wherein said carriage is connected to a chain with a plurality of chain segments in which supply lines are guided.

21. The adjusting unit according to claim 16, wherein a pair of plate-like gripper elements and one centering element are assigned to each support rail.

* * * * *